(12) United States Patent
Foldyna

(10) Patent No.: US 10,209,312 B2
(45) Date of Patent: Feb. 19, 2019

(54) APPARATUS AND METHODS FOR EVALUATING CEW ENERGY CELL PERFORMANCE

(71) Applicant: Ivo Foldyna, Boise, ID (US)

(72) Inventor: Ivo Foldyna, Boise, ID (US)

(*) Notice: Subject to any disclaimer, the term of this patent is extended or adjusted under 35 U.S.C. 154(b) by 314 days.

(21) Appl. No.: 15/255,613

(22) Filed: Sep. 2, 2016

(65) Prior Publication Data

US 2017/0059661 A1    Mar. 2, 2017

Related U.S. Application Data

(60) Provisional application No. 62/213,304, filed on Sep. 2, 2015.

(51) Int. Cl.
| | |
|---|---|
| *G01R 31/36* | (2006.01) |
| *H01M 10/42* | (2006.01) |
| *H01M 10/44* | (2006.01) |
| *H01M 10/48* | (2006.01) |
| *F41H 13/00* | (2006.01) |
| *F42B 35/00* | (2006.01) |

(52) U.S. Cl.
CPC ..... *G01R 31/3627* (2013.01); *G01R 31/3648* (2013.01); *G01R 31/3658* (2013.01); *G01R 31/3662* (2013.01); *H01M 10/4285* (2013.01); *H01M 10/44* (2013.01); *H01M 10/48* (2013.01); *F41H 13/0012* (2013.01); *F42B 35/00* (2013.01); *H01M 2220/30* (2013.01)

(58) Field of Classification Search
CPC ............ G01R 31/3627; G01R 31/3662; G01R 31/3648; G01R 31/3658; H01M 10/48; H01M 10/44; H01M 10/4285; H01M 2220/30; F42B 35/00; F41H 13/0012
USPC ...................... 324/72.5, 426, 436
See application file for complete search history.

(56) References Cited

U.S. PATENT DOCUMENTS 6,411,098 B1 * 6/2002 Laletin ............ G01R 19/16542
                                                          320/161

* cited by examiner

*Primary Examiner* — Farhana A Hoque
(74) *Attorney, Agent, or Firm* — Billion & Armitage; John F. Klos

(57) ABSTRACT

A method and apparatus for evaluating CEW performance, in particular by evaluating a battery pack condition state via direct or indirect means. A two-tier load test for a CEW battery pack and an indirect wireless spark analysis tool are disclosed.

13 Claims, 14 Drawing Sheets

APPARATUS AND METHODS FOR EVALUATING CEW ENERGY CELL PERFORMANCE

RELATED APPLICATIONS

This application claims the benefit of U.S. Provisional Application No. 62/213,304, filed Sep. 2, 2015, and incorporated herein by reference.

BACKGROUND OF THE INVENTION

Conducted electrical weapons (CEW) utilize a lithium energy cell based power supply. TASER-brand CEWs include, for example, a "digital power magazine" (DPM) or tactical performance power magazine (TPPM) incorporating multiple lithium batteries and related circuitry.

Routine evaluation of energy cell performance characteristics is required to verify that the CEW's energy cell and core electronics are properly functioning. Energy cells are replaced when battery degradation exceeds a threshold level. Many energy cells are disposable (non-rechargeable) and accurate evaluation of energy cell performance characteristics is critical to avoid waste.

The Taser-brand DPM is a proprietary product and the manufacturer offers no external means to evaluate the DPM condition. The DPM is evaluated only through on-board diagnostics of the CEW. This requires that the DPM be inserted into the CEW and the CEW is then powered up prior to the test. This test protocol is both time consuming and cumbersome.

Routine, though crude, "spark tests" are prescribed to evaluate energy cell performance. Such tests rely on an individual operator's ability to audibly detect "any unusual spark rates" over the course of the spark test. The operator's ability to audibly detect any unusual spark rates is highly subjective and therefore more empirical means to detect changes in CEW spark pulse rate is needed.

SUMMARY

To achieve the foregoing objects, and in accordance with the purpose of the invention as embodied and broadly described herein, an apparatus and methods for evaluating energy cell performance characteristics is disclosed.

Embodiments of the present disclosure include a direct method and apparatus for characterizing energy cell performance utilizing internal resistance measurements of the lithium battery pack.

Another embodiment of the present disclosure includes a method and apparatus for characterizing energy cell performance using an indirect method by evaluating electrical pulses, such as during a prescribed "spark test."

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which.

DETAILED DESCRIPTION OF THE INVENTION

Direct Evaluation Approach

The TASER digital power magazine (DPM) is a lithium energy cell power supply system with an onboard memory chip that maintains a record of vital operational status information, such as remaining power level, energy cell performance, and life expectancy for the energy cell pack under varying temperatures and loads. The DPM consists of several disposable (primary) batteries connected in series and encapsulated in plastic enclosure. The batteries terminal (positive and negative) ends are internally connected to the DPM terminal connector.

Figure 1A:
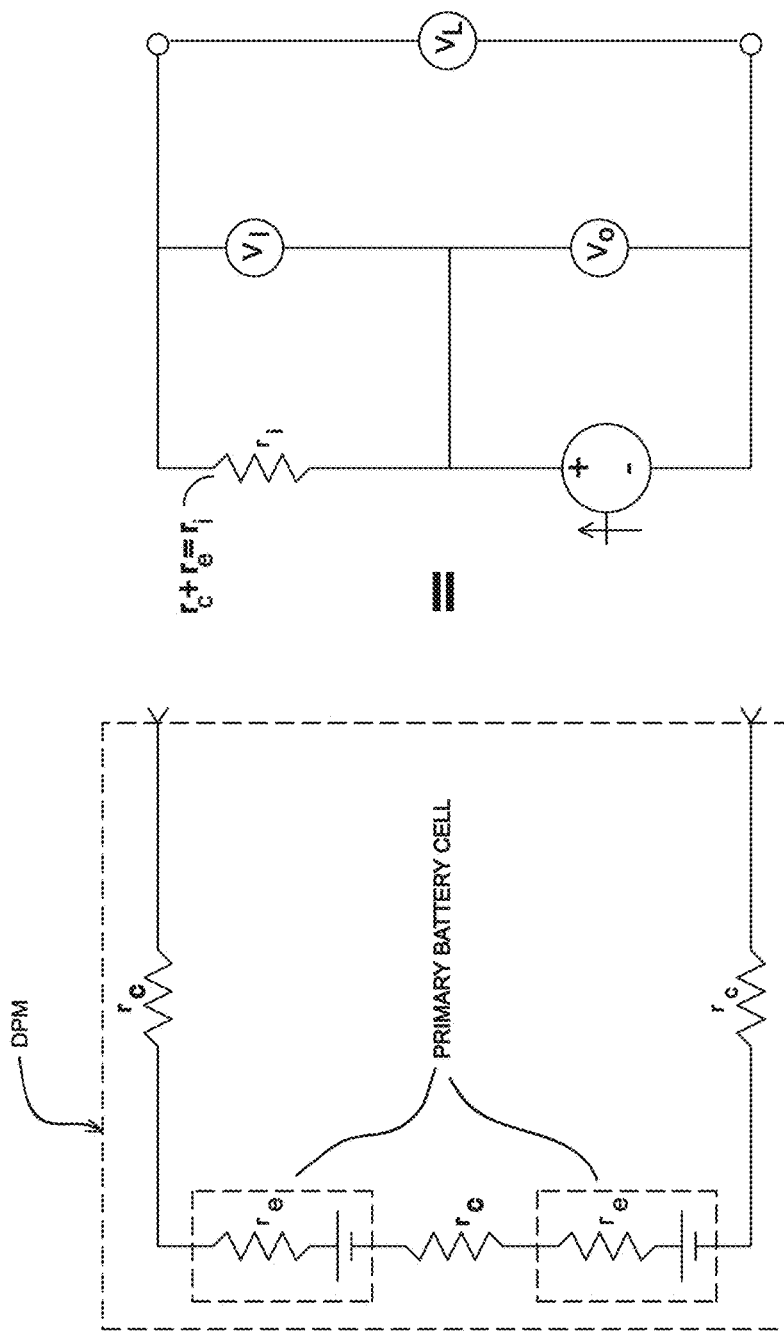
FIG. 1A illustrates a simplified equivalent circuit model of the TASER DPM.

FIG. 1A depicts a simplified equivalent circuit model of the DPM. As illustrated, the DC resistive path is a combination of the battery cells electrochemical resistance $r_e$ in series with the combined resistance of the interconnecting terminals $r_c$. The DPM battery capacity is of limited use if the pack cannot deliver the stored energy effectively. To supply the required power the DPM needs low internal resistance. Therefore the combined internal resistance of the DPM $r_e + r_c = R_i$ and directly relates to the DPM's ability to deliver the required energy to the weapon system.

When no current is drawn from the battery, the voltage across the battery terminals is referred to as the "open" voltage. But when a current I is drawn from the battery (loaded voltage), there is a voltage drop $V_I = I*Ri$ across the combined internal resistance, so the voltage drop V across the battery is decreased to $$V_L = V_o - V_I$$

Hence the larger the current drawn, the smaller the DPM terminal voltage. Furthermore the larger internal resistance the greater the DPM internal energy loss that manifests as waste energy in a form of heat Q.

$$Q = I^2 * R_i * t$$

Because the CEW power demand is such that the weapon loads the battery with short, large current pulses, characterization of the low DPM internal resistance is paramount.

A properly functioning DPM has internal resistance that remains relatively constant throughout the intended operational life. Because of the predictive nature of the manufacturers determination of the DPM remaining energy level even a "defective" DPM with high internal resistance would not be detected by the weapon internal diagnostics.

Predictive methods of evaluating DPM capacity, such as used in TASER-brand CEW, rely on indirect quantification of the remaining battery capacity. This method is predicated on "knowing" and keeping record of how much energy has been drawn from ideally full DPM energy capacity. This information is then stored in the DPM on board memory. Further this method is also predicated on "knowing" what the DPM energy capacity is. The CEW on board computer determines (predicts) the DPM remaining power capacity by subtracting the "known" cumulative power (stored in the DPM onboard memory) used by the CEW from the "known" (tabulated) full power capacity of the energy cells.

Figure 1B:
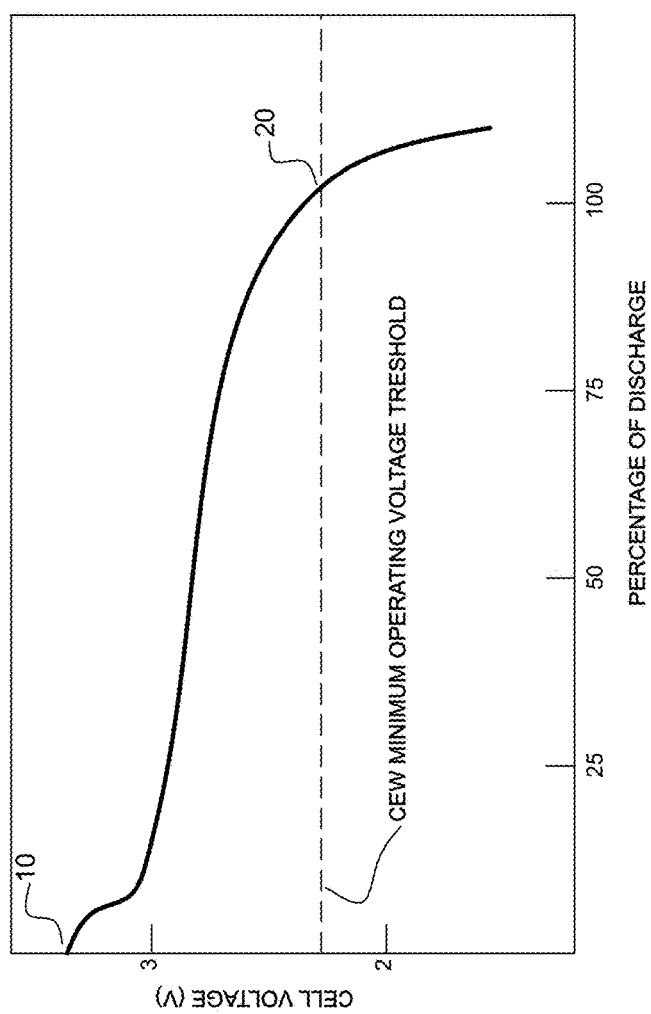
FIG. 1B illustrates a graphical relationship between battery voltage and discharge percentage of a typical lithium battery.

FIG. 1B depicts a typical DPM discharge curve of a standard lithium primary cell battery with a static (resistive) load. The initial voltage of the battery is indicated as numeral 10, i.e., the 0% discharged state. The voltage at 100% battery discharged state is indicated as numeral 20. As shown, battery voltage rapidly drops after exceeding 100% discharge state. The method of one embodiment of the present disclosure draws on the fact that the remaining capacity of the DPM closely follows the "known" discharge curve. However in contrast with the predictive method that relies on the assumption that the DPM energy cells always start at 100% capacity and that that the discharge curve always follows the pre-determined signature, this method draws a direct comparison between the DPM reported and indirectly determined remaining capacity as stored in the DPM's onboard memory and an empirical measurement of the terminal voltage.

A number of factors can negatively affect the DPM internal resistance such as: age, improper storage, extreme temperature, battery cell internal defects, terminal connection defects and corrosion.

Figure 2:
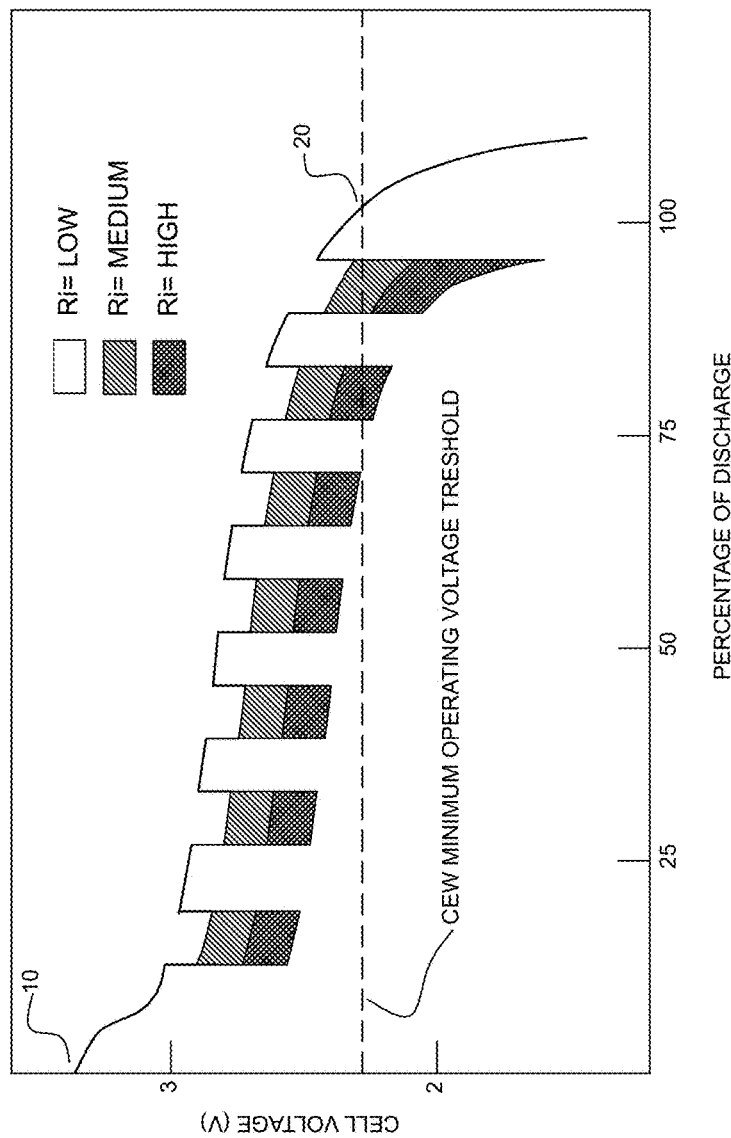
FIG. 2 illustrates a graphical relationship between battery voltage and battery life with varying internal resistances.
Figure 3:
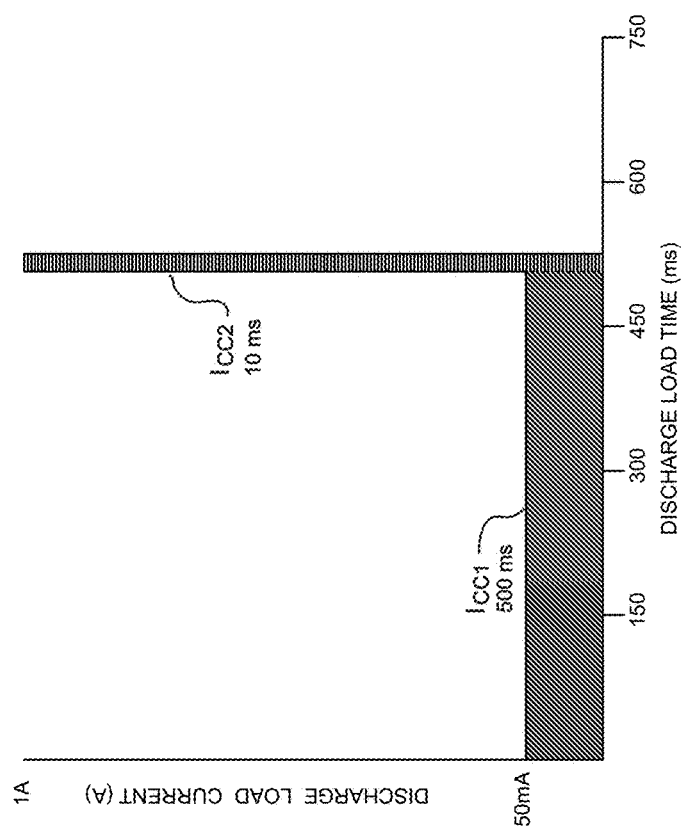
FIG. 3 illustrates a graphical relationship between current and time for a DPM under test.

FIG. 2 demonstrates the voltage signature of a DPM with low, medium and high internal resistance when connected to the weapon. The terminal voltage of a DPM with high internal resistance modulates the supply voltage to the weapon and produces voltage dips, reflecting the load pulses. These pulses push the DPM terminal voltage towards the threshold minimum voltage line for the weapon to perform to specification. As seen in the drawing, the internal resistance is a significant factor for the DPM's proper operation and a higher than "per specification" internal resistance will deprecate the weapons performance even with a seemingly "OK" DPM (if evaluated with a "static"— not pulsed load).

A two-tier DC load method is implemented to determine the DPM internal resistance Ri. Applying two sequential discharge loads controlled by the microprocessor of different currents and time durations. The DPM first discharges at a low constant current load Icc1 for 500 milliseconds while the DPM terminal voltage is sampled as Vcc1. This followed by a higher constant current load Icc2 for 10 milliseconds. The DPM terminal voltage is sampled during the second discharge as Vcc2.

A 16 bit precision A/D converter may be used to measure the voltage levels at the DPM terminals. Ohm's law is used to calculate the DPM internal resistance Ri.

$$Ri = \frac{Vcc1 - Vcc2}{Icc2 - Icc1}$$

By dynamically/taking multiple measurements the voltage signature under the two load conditions offers additional information about the DPM such as if the DPM manufacturer's predictive energy level is in "alignment" with the measured information. Comparing the actual internal resistance with the resistance of a new DPM will provide an indication of any deterioration in the DPM performance.

A PASS/FAIL/WARNING conditions can be computed and presented to the user. Additionally supplemental information displaying measured and computed values such as the DPM terminal voltages and the internal resistance can be available for the advanced user.

In one embodiment of the present invention, the PASS signal corresponds to the loaded voltage above the DPM cut off curve and in alignment with the predictive value stored in the DPM. The WARNING signal is same except out of alignment. A FAIL signal may be generated when the predictive value stored in the DPM on-board memory reports the remaining DPM energy to be in excess of 30% but the measured loaded voltage is more than 1% below the cut off curve voltage.

Figure 4:
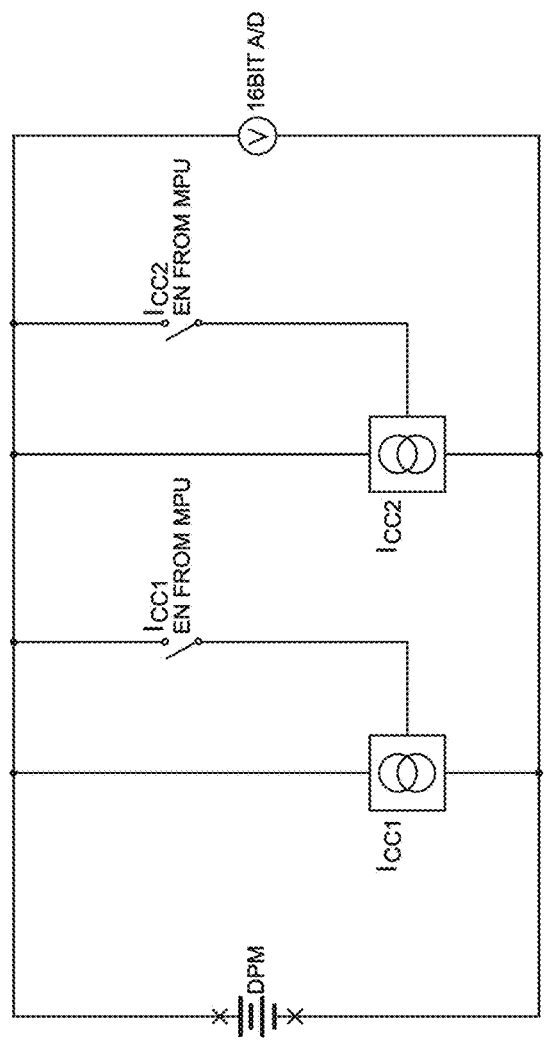
FIG. 4 illustrates an equivalent circuit model for a two-tier DC load test in accordance with an embodiment of the present disclosure.

FIG. 4 represents the equivalent circuit model for the two-tier DC load and measurement implementation. $I_{cc1}$ implements the first low constant current load and $I_{cc2}$ implements the second high constant current load.

Figure 5:
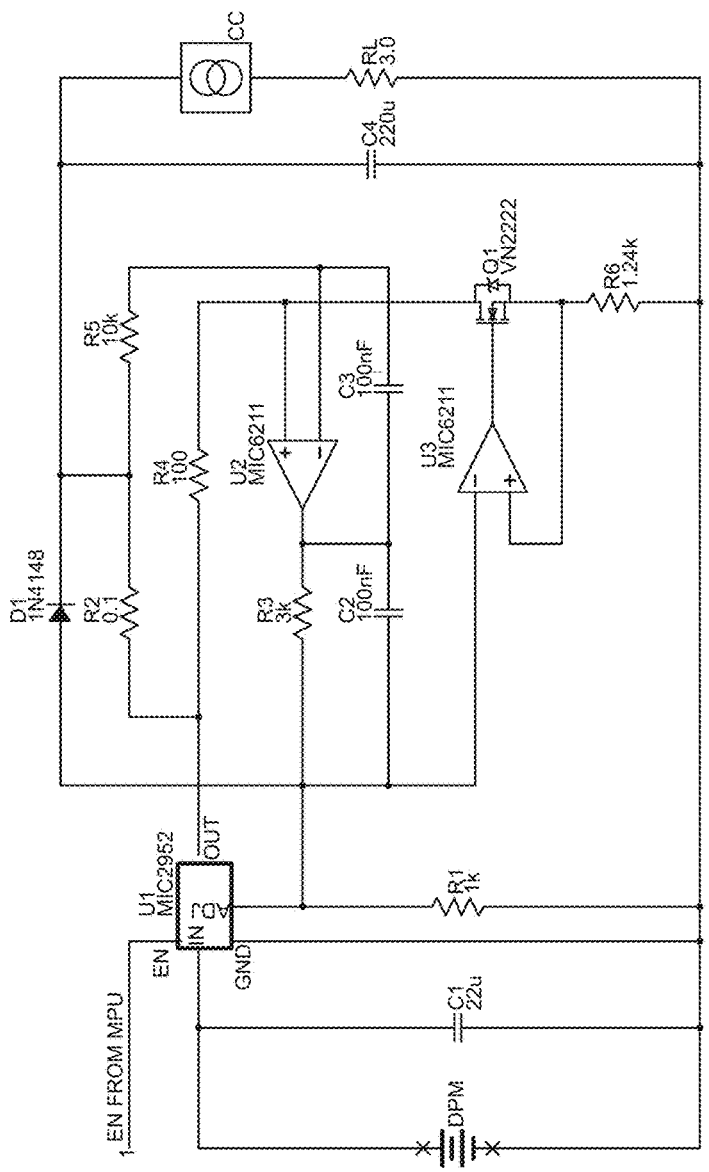
FIG. 5 illustrates a schematic for a constant current load module in accordance with an embodiment of the present disclosure.

FIG. 5 provides a schematic for constant current load module as described above. The MIC29152WT is high current, high accuracy, low-dropout voltage regulator. A pair of MIC6211 operational amplifiers complete the load circuit assuring a constant current flow through the resistor $R_L$ regardless of the DPM's terminal voltage.

By design the MIC29152WT assures minimal ground current leakage and the five terminal IC features logic level ON/OFF (enable) control from the testers MPU.

In general terms, one example of the DC load method is implemented by applying two sequential discharge loads of different currents and time durations. In one example, the DPM first discharges at a low constant current for 500 milliseconds, followed by a higher constant current for 10 milliseconds.

Indirect Evaluation Approach

Figure 6:
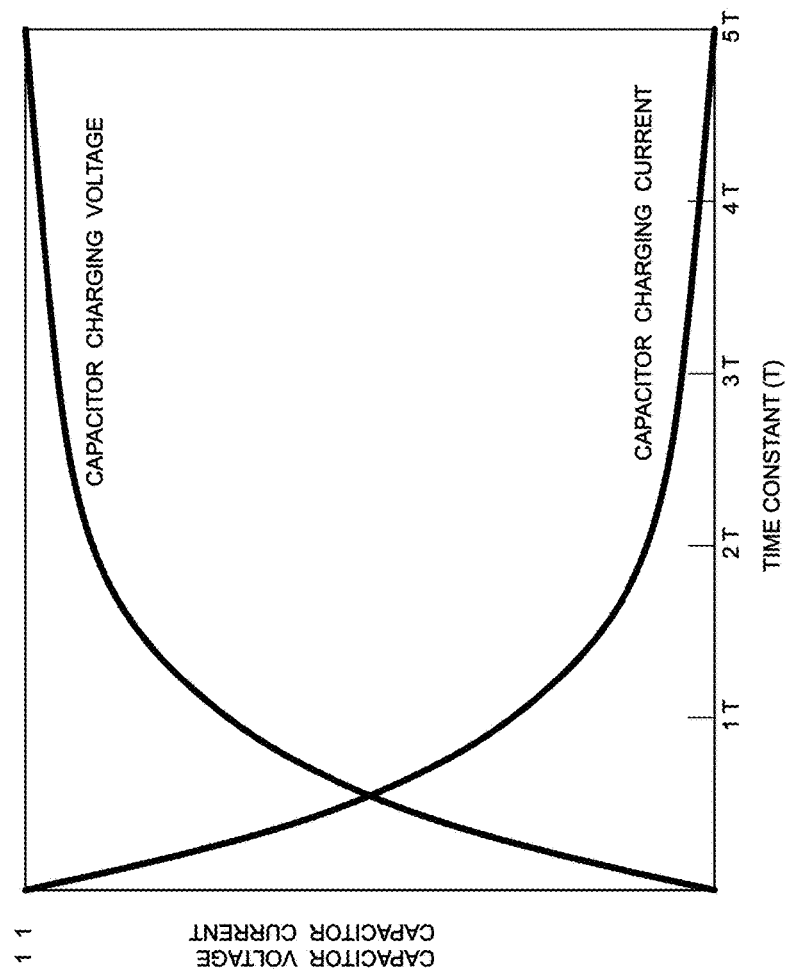
FIG. 6 depicts a graphical relationship between capacitor voltage and charger current over time.

The fundamental principle of Conducted Electrical Weapons (CEWs) is the conversion of energy cell (battery pack) DPM supplied DC voltage into a train of high voltage pulses. This low voltage to high voltage conversion in very simple terms can be explained using an equivalent circuit, including a battery connected to a series resistor and a capacitor. The initial current is high as the battery charges the capacitor. The charging current is inversely proportional to the capacitors voltage and as the capacitor becomes charged up to the battery voltage. FIG. 6 illustrates such a relationship between capacitor voltage and charging current over time.

Charging the capacitor stores energy in the electric field between the capacitor plates. The rate of charging is typically described in terms of a time constant RC. The "slowly" stored energy in the capacitor is in turn rapidly discharged in-to a step-up transformer, hence creating a short duration high voltage pulse.

In simple terms the power demand for the energy to be delivered by the battery is dynamic but closely resembles the RC charging time constant of the CEW devices main capacitor. Through power regulation the CEW maintains the pulse output at a constant rate as long as the battery can deliver a sufficient amount of energy to the main capacitor before the "next" pulse.

When the stored energy of the DPM is insufficient for proper CEW operation, the time required to charge the main capacitor becomes longer and the CEW pulse output is no longer constant. Therefore monitoring and analysis of the CEW duration between each pulse can be used to indirectly characterize the DPM operational status or "health".

Figure 7:
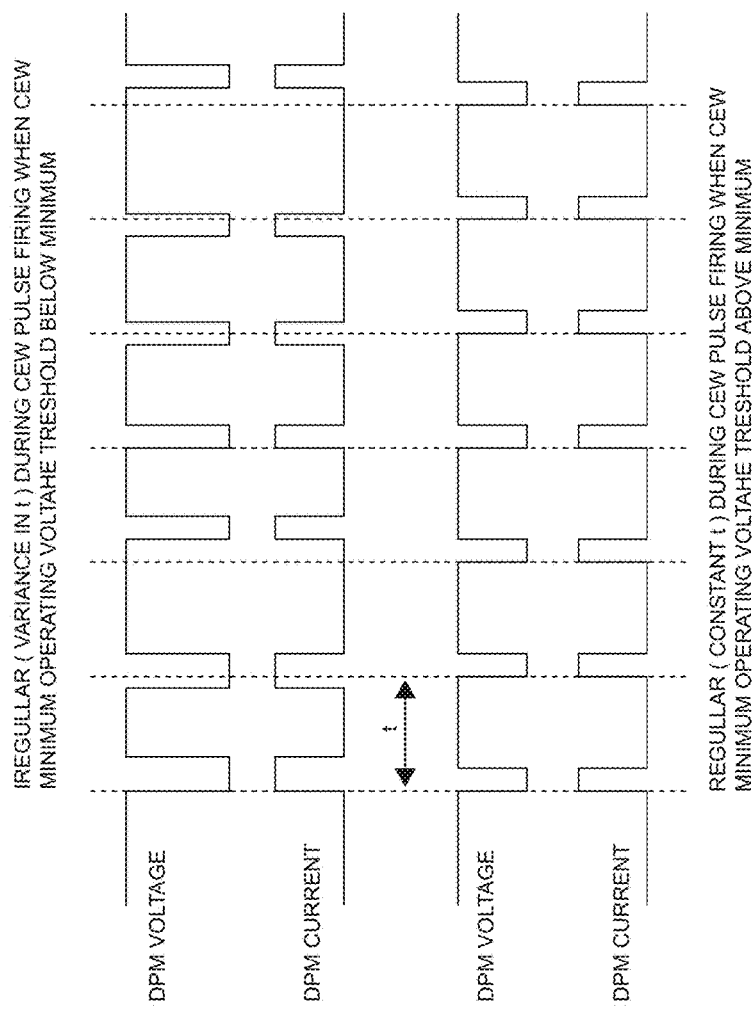
FIG. 7 illustrates a graphical relationship between DPM voltage and current over time for normal and exhausted DPM conditions.

Additionally, it may be desirable to monitor aspects of the CEW pulse duration as diagnostic information to further assess the CEW compliance with the manufacturer specifications. For example, a variance in the CEW pulse rate when the DPM provides an adequate energy for a normal operation may be an early predictor of CEW malfunction or failure. FIG. 7 illustrates DPM voltage and current signals for normal and abnormal operating conditions.

Because of the nature of the electrical output of the CEW (which can deliver in excess of 50,000 volts per each pulse), obtaining a useful electrical signal for a measurement via direct "galvanic" connection between the measured CEW and the measuring apparatus is not practical.

Another embodiment of the present disclosure includes a method and apparatus for precisely measuring the time duration between each individual pulse when the CEW is outputting pulses, such as during the manufacturer's recommended "spark test".

The origin of this method for obtaining the pulse duration between individual pulses is based on the observation that CEW high voltage pulses cause electromagnetic disturbances and intense electric fields which can be wirelessly detected and converted to a useful digital signal.

The apparatus includes a wireless receiver tuned to the CEW pulse energy spectrum, a pulse shaping circuit, and a microprocessor for calculating the pulse duration between each pulse and for providing additional test statistics. The apparatus can further include a wireless transmitter, which may be optional.

Figure 8:
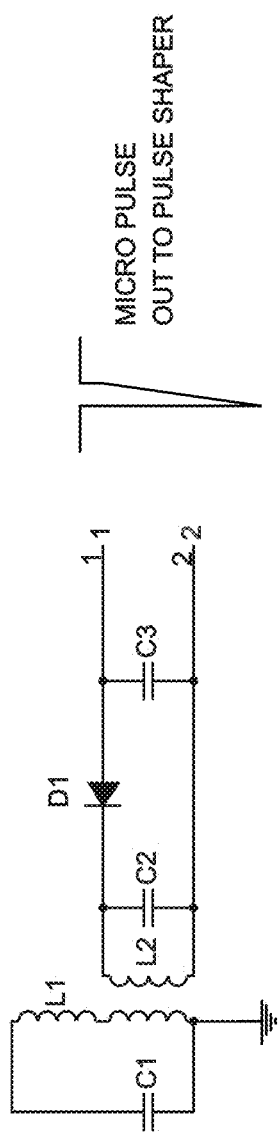
FIG. 8 illustrates a simplified crystal radio receiver used in connection with another embodiment of a DPM tester in accordance with the present invention.

FIG. 8 depicts a simple crystal radio receiver. A crystal radio receiver with a tuned circuit, consisting of a coil and a capacitor connected together acts as a resonator. The coil and the capacitor is tuned to resonate with the CEW pulse frequency. A silicon diode is utilized as the pulse detector and feeding in to the pulse shaping circuit.

Figure 9:
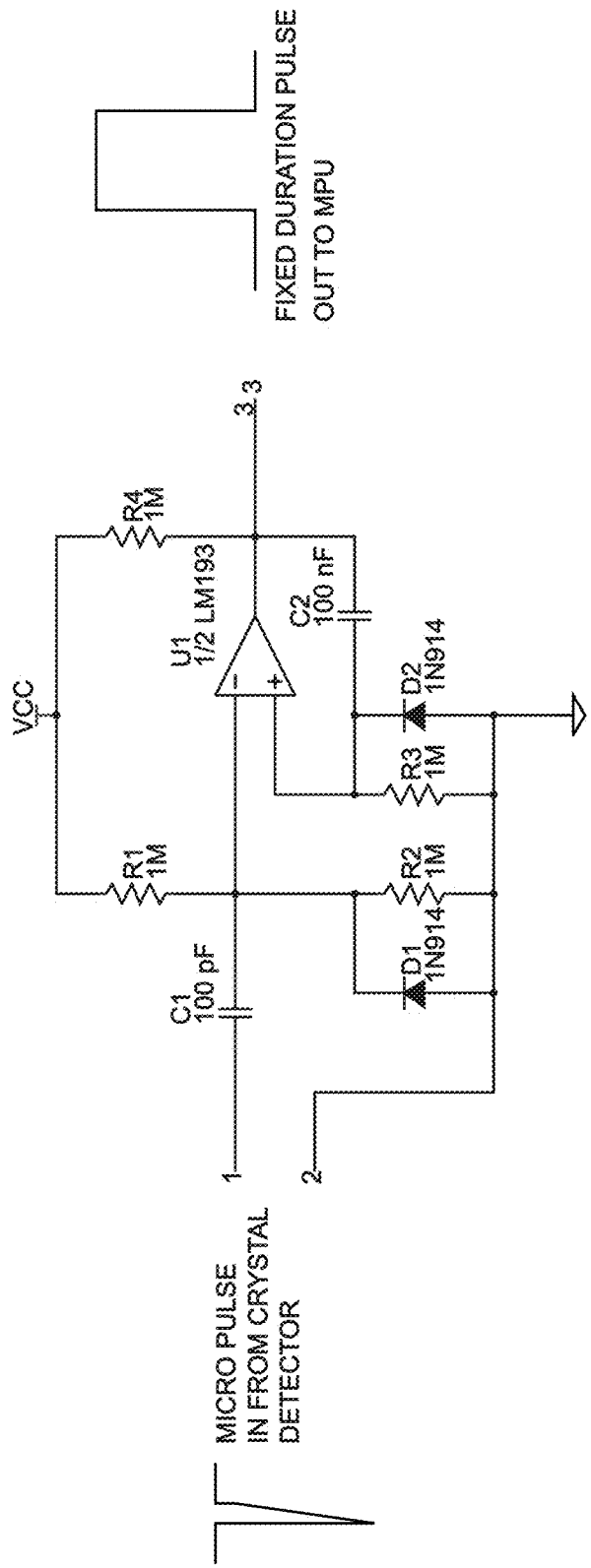
FIG. 9 illustrates a schematic of one embodiment of a pulse-shaping circuit used in connection with an embodiment of a DPM tester in accordance with the present invention.

FIG. 9 is one embodiment of a pulse shaping circuit. The pulse shaping circuit amplifies, filters and converts the received pulse in to a single fixed duration/fixed amplitude pulse to be processed by the microprocessor. The microprocessor sequentially processes each individual pulse by registering and storing the time of the pulse front edge and waits for the arrival of the next pulse to do the same. Once the pulse train stops a timeout mechanism triggers a simple algorithm that compares the stored timestamp of each pulse with the next. A subtraction of $t_2-t_1$ gives the delta net time between each pulse. This delta net time is stored for further statistical processing to generate statistical information about the pulse train received such as but not limited to: overall duration of the time train, total number of pulses contained within the pulse train, average frequency of the pulses, average time between individual pulses, maximum time between individual pulses, minimum time between individual pulses, standard deviation.

Figure 10:
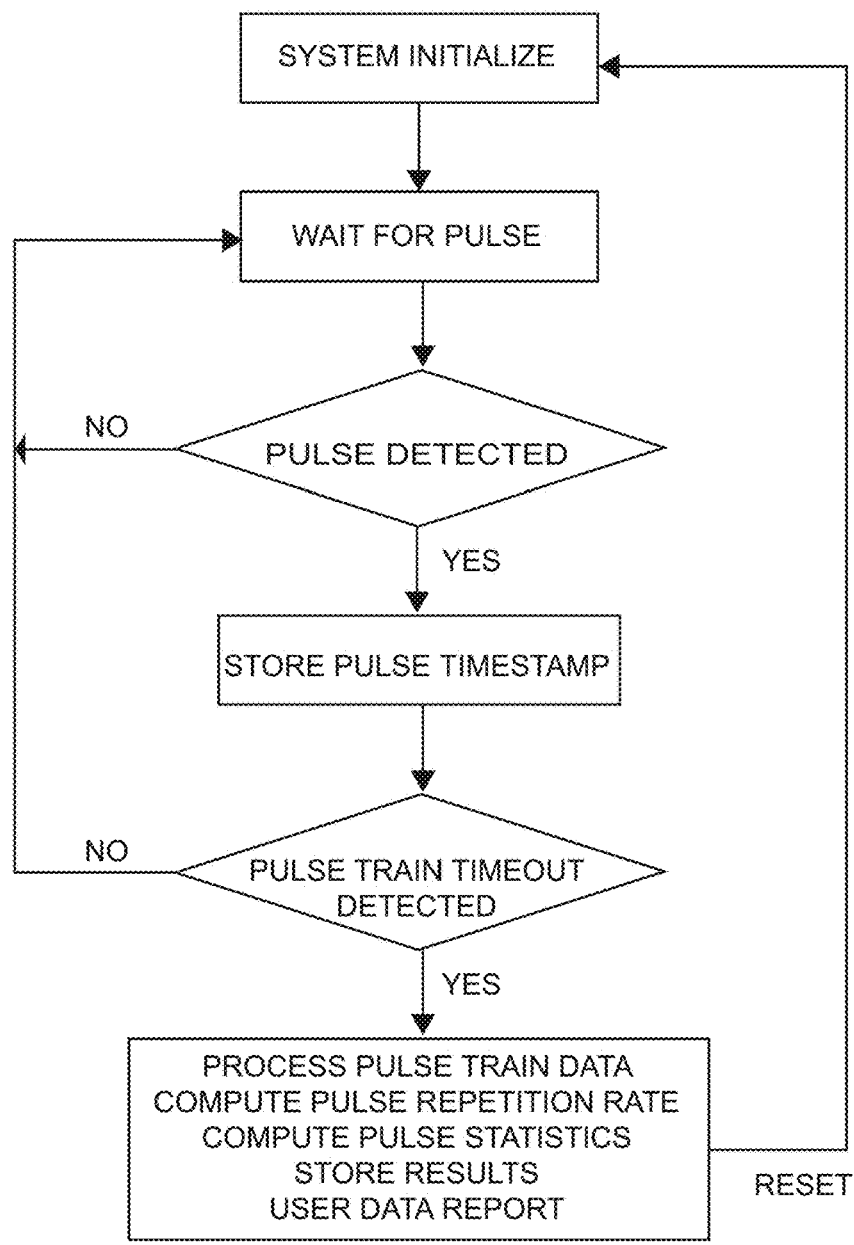
FIG. 10 illustrates a simplified flowchart for capturing and evaluating pulse information of a DPM undergoing analysis with a DPM tester of the present disclosure.

FIG. 10 depicts a simplified flowchart for capturing and evaluating pulse information, such as during a "spark test" of the weapon.

Certain test protocol require that the CEW under test must have its "output" terminals connected to a non-inductive resistive load. Another embodiment of the present disclosure includes a method and apparatus for galvanic connection of the load resistor to the CEW as a stand-alone attachment, including a portable hand-held module containing only passive electrical load circuitry.

Such an arrangement provides the required resistive load for the CEW under test and maintains complete galvanic isolation from the "active" apparatus that wirelessly receives and processes the signals. This arrangement also acts as a transmitting antenna and significantly increases the distance from the CEW under test to the DPM test receiver as compared to receiving signals from a CEW without the module.

This method and apparatus is complementary to the above described apparatus and method of characterization of the DPM indirectly/wirelessly. Yet, it provides a stand-alone means to reliably and repeatedly measure the CEW pulses output. This method can be employed as a portable device described here but also in another embodiment it can be part of another system used to acquire the CEW output such as but not limited to the pulse timing information.

Because the electrical output from the CEW device is both high voltage and high frequency, conventional direct/galvanic connection to obtain the signal measurements is subject to many subtleties making the results possibly inaccurate, unreliable and difficult if not impossible or repeatable.

Environmental factors that affect the measurement accuracy are temperature, humidity, and elevation. A variation in each of these factors will increase or decrease the arcing break over voltage. The device mechanical dimensions that affect the peak arcing voltage is the precise distance between the two probe points in front of the weapon. Slightly closer probe points will result in slightly lower peak voltages before the arc is generated. If two weapons have identical spacing between the probes and are tested on the same day with the same equipment, the results should be identical.

Further this arrangement mitigates the environmental and physical arrangement factors and also the electrical characteristics of the non-inductive high voltage load resistor thus providing a standard to the measurement of the electrical output from the CEW under test.

The electrical output as described previously can be captured and processed wirelessly but also "ports" for measurement of the current and voltage across the load resistor provide for obtaining the electrical output signals by conventional methods.

There are two significant attributes of this embodiment that mitigate the factors that may significantly distort the CEW electrical output measurement.

First, mechanical/galvanic connection to the CEW output probes is facilitated by a portable attachment that fits tightly over the CEW output probes making a solid galvanic connection. Because of the tight tolerance of such apparatus this galvanic/mechanical connection is repeatable and consistent.

Second, proper measurement of the CEW weapon output signal with a known resistive load also requires a spark gap between the CEW output terminals and the load resistor. The formation of this electrical arc is subject to many environmental factors and physical distance between the gaps but they are also subject to wear by oxidization of the arcing electrodes. These variable factors are mitigated in this invention by implementation of a gas discharge tube (GDT) connected in series with the load resistor. Unlike "conventional" arc gap where the air is ionized between two conductors providing inconsistent medium for the current flow, the GDT encapsulates and confines the two arc gap electrodes in a sealed enclosure free and isolated from the external atmosphere. This provides for maintenance free and consistent, reliable and repeatable arc during the CEW discharge.

Figure 11:
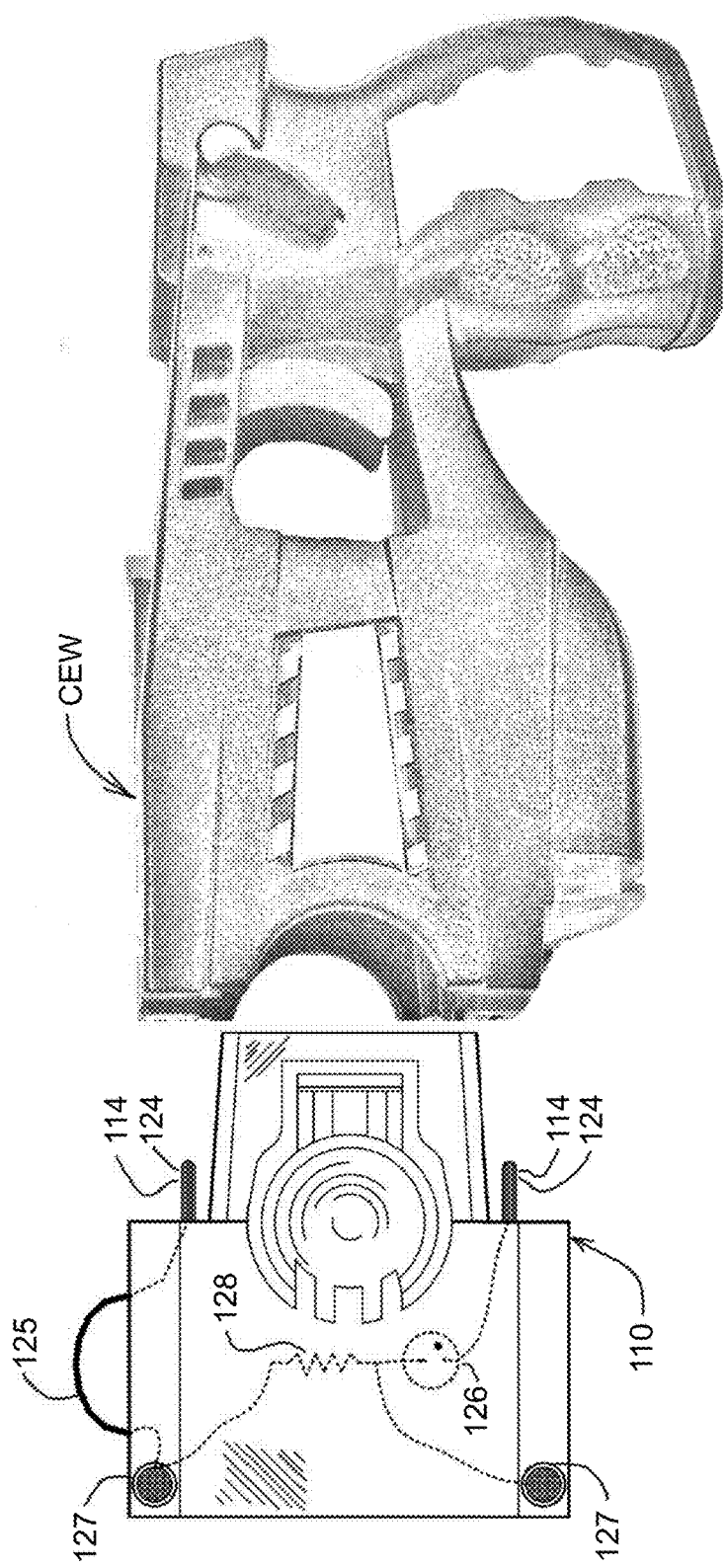
FIG. 11 illustrates an embodiment of an external load module for use during a spark test evaluation.

FIG. 11 illustrates one embodiment of an external load module for use during evaluation of a spark test. The module 110 includes an enclosure 112 and multiple terminals 114. Terminals 114 may be spring-loaded.

Figure 12:
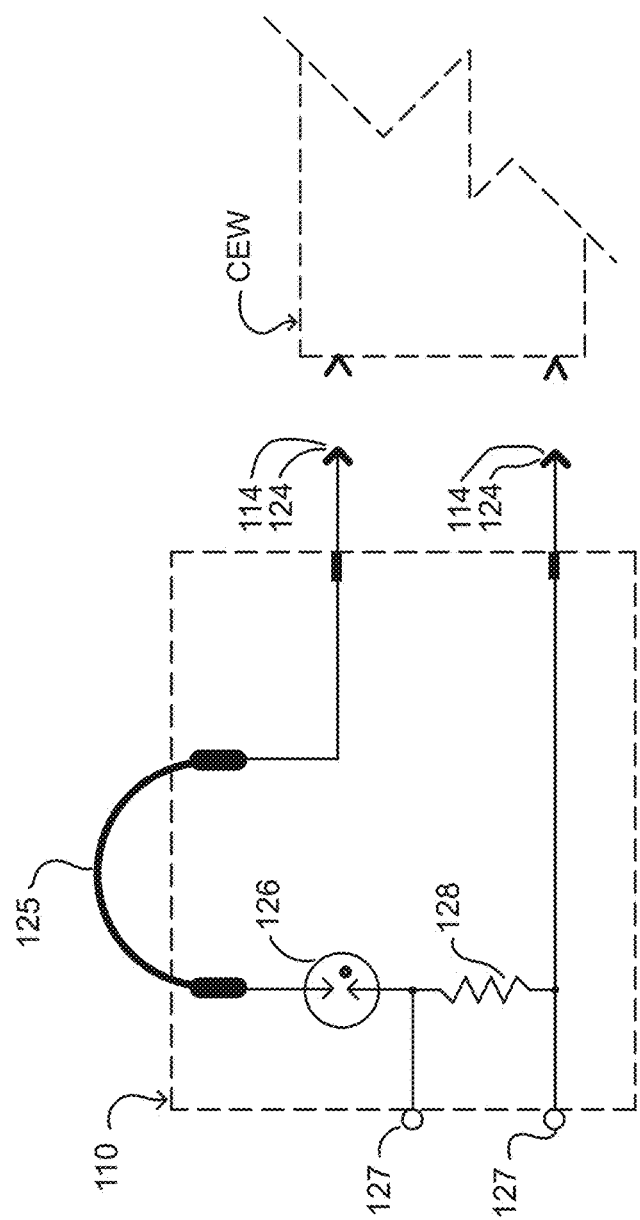
FIG. 12 illustrates internal components of the external load module of FIG. 11.

FIG. 12 illustrates internal components of the external load module 110 of FIG. 11. Load module 110 includes input terminals 124, a current probe port 125, gas discharge tube 126, voltage probe port 127, and high voltage inductanceless load resistor 128.

Figure 13:
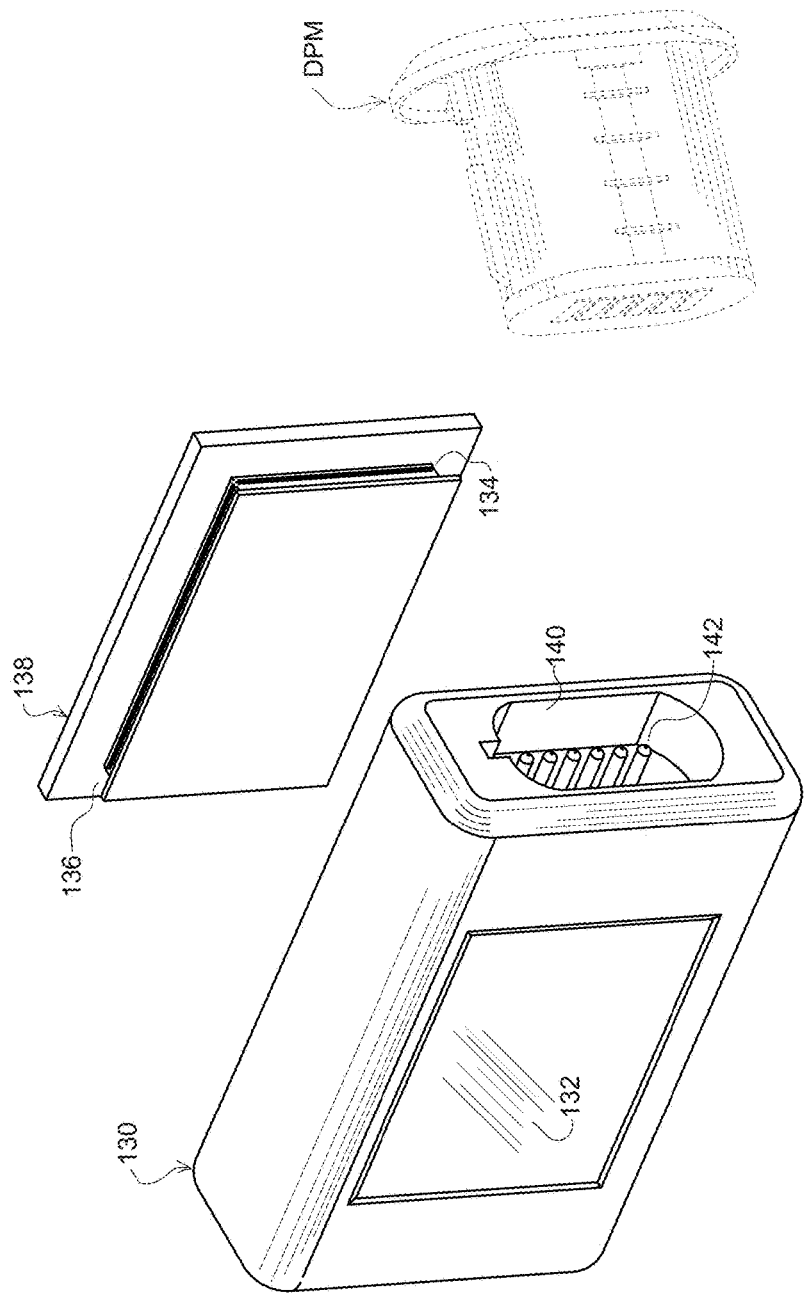
FIG. 13 illustrates another embodiment of a DPM tester in accordance with the present disclosure.

FIG. 13 illustrates another embodiment of the DPM tester combined with the wireless receiver for use during evaluation during a spark test. A body 130 houses internal electronics, a user interface including but not limited to a LCD screen 132, an antenna coil 134 wound in the groove 136 of a back cover 138, a DPM receptor bay 140, and modular DPM contact connector 142.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of evaluating performance of a CEW energy cell comprising:
  inserting a CEW energy cell into an input port of a portable test device;
  performing a two-tier DC load test on the CEW energy cell by sequentially applying at least two different loads to the CEW energy cell, including a low constant current load and a high constant current load;
  evaluating a voltage signature under the two-tier load test;
  determining at least one internal resistance value based on said voltage signature; and
  outputting at least one indicator relating to CEW energy cell status based on said determining.

2. The method of claim 1 wherein said outputting including providing a visual display to the user.

3. The method of claim 2 wherein the visual display includes one or more of the following indications: PASS, FAIL and WARNING.

4. The method of claim 1 wherein the low constant current load is applied for approximately 500 milliseconds.

5. The method of claim 1 wherein the high constant current load is applied for approximately 10 milliseconds.

6. The method of claim 1 further comprising:
  inserting the CEW energy cell into a CEW and performing a spark test wherein a pulse train of high energy sparks is generated by the CEW;
  receiving with a wireless receiver a pulsed, spark test signal emitted from the CEW;
  providing a pulse shaping circuit and modifying the spark test signal with the pulse shaping circuit;
  calculating the pulse duration between each pulse based on an output from the pulse shaping circuit; and
  evaluating a condition of the CEW energy cell based on calculated pulse durations.

7. A method of evaluating performance of a CEW energy cell comprising:
  performing a spark test with the CEW wherein a pulse train of high energy sparks is generated by the CEW;
  receiving with a wireless receiver a pulsed, a spark test signal emitted from the CEW during the spark test;
  providing a pulse shaping circuit and modifying the spark test signal with the pulse shaping circuit;
  calculating the pulse duration between each pulse based on an output from the pulse shaping circuit; and
  evaluating a condition of the CEW energy cell based on calculated pulse durations.

8. The method of claim 7 wherein the wireless receiving comprises a crystal radio receiver with a circuit tuned to resonate with the CEW pulse frequency.

9. The method of claim 7 wherein the pulse shaping circuit amplifies, filters and converts the received pulse into a fixed duration or fixed amplitude pulse to be processed by a microprocessor.

10. The method of claim 9 wherein the microprocessor generates statistical information about the pulse train including: overall duration of the time train, total number of pulses contained within the pulse train, average frequency of the pulses, average time between individual pulses, maximum time between individual pulses, minimum time between individual pulses, and standard deviation.

11. An apparatus for evaluating performance of a CEW energy cell comprising, comprising:
   a portable housing having an input port size to receive and electrically couple to at least a portion of a DPM;
   a two-tier DC load test circuit connected to terminals of the DPM, including a low constant current load and a high constant current load, said circuit sequentially applying the two loads to the DPM terminals;
   a voltage sensor which receives a signal from the two-tier DC load test circuit; and
   a microprocessor which receives and evaluates a signal from the voltage sensor and outputs at least one indication of DPM condition based on said evaluated signal.

12. The apparatus of claim 11 wherein the output is displayed to a user via a user interface on the portable housing.

13. The apparatus of claim 12 wherein the output is transmitted from the portable housing to a remote location.

\* \* \* \* \*